United States Patent [19]

Grubisich et al.

[11] Patent Number: 5,451,546
[45] Date of Patent: Sep. 19, 1995

[54] MASKING METHOD USED IN SALICIDE PROCESS FOR IMPROVED YIELD BY PREVENTING DAMAGE TO OXIDE SPACERS

[75] Inventors: Michael J. Grubisich; Christopher S. Blair, both of San Jose, Calif.

[73] Assignee: National Semiconductor Corporation, Santa Clara, Calif.

[21] Appl. No.: 209,087

[22] Filed: Mar. 10, 1994

[51] Int. Cl.6 .................. H01L 21/44; H01L 21/48
[52] U.S. Cl. ...................... 437/200; 437/32; 437/34; 437/192
[58] Field of Search ............ 437/200, 32, 34, 192

[56] References Cited

U.S. PATENT DOCUMENTS

| | | | |
|---|---|---|---|
| 4,764,480 | 8/1988 | Vora | 437/54 |
| 5,139,961 | 8/1992 | Solheim et al. | 437/33 |
| 5,298,440 | 3/1994 | Jerome et al. | 437/200 |

Primary Examiner—Olik Chaudhuri
Assistant Examiner—H. Jey Tsai
Attorney, Agent, or Firm—H. Donald Nelson; Brian D. Ogonowsky; Richard J. Roddy

[57] ABSTRACT

A masking method for use in a silicide formation process is disclosed herein which prevents an oxide etching solution from tunneling under a photoresist masking layer and damaging oxide spacers not intended to be etched. This process may be used during the formation of a bipolar or MOS transistor formed in an isolated silicon island. A mask opening used to etch exposed oxide spacer portions is made to not expose any parasitic oxide spacers formed along an edge of the isolated silicon island. In this way, an oxide etch solution is prevented from tunneling along the parasitic oxide spacer and reaching any intersecting oxide spacers not intended to be etched. The desired oxide spacers will thus be intact to properly isolate silicide portions formed over exposed silicon and polysilicon surfaces.

9 Claims, 5 Drawing Sheets

MASKING METHOD USED IN SALICIDE PROCESS FOR IMPROVED YIELD BY PREVENTING DAMAGE TO OXIDE SPACERS

FIELD OF THE INVENTION

This invention relates to integrated circuit technology and, in particular, to an improved masking method used in the formation of a self-aligned silicide layer for increasing yield and maintaining high performance of bipolar, CMOS, and BiCMOS devices.

BACKGROUND OF THE INVENTION

In integrated circuit processing, it is well known to form a low resistivity silicide layer over a region of silicon or polysilicon. It is sometimes desirable to form a continuous silicide layer over both a polysilicon line and an adjacent silicon region to short the line and the region together, while insulating the silicide layer from other polysilicon lines and other silicon regions.

A silicide is generally formed by depositing a layer of refractory metal, such as titanium, cobalt, tungsten, platinum, or tantalum, on an exposed silicon (or polysilicon) surface of a wafer and then heating the wafer to alloy the silicon surface with the refractory metal to form a silicide (e.g., $TiSi_2$). Since the deposited refractory metal does not alloy with oxide, the layer of pure refractory metal may be easily removed from over any oxide portions on the wafer using a selective etching solution. Thus, forming self-aligned silicide (called salicide) is a very effective tool to improve the performance of integrated circuit components.

In order to prevent a silicide layer from undesireably shorting together a polysilicon line and an adjacent single crystal silicon region, the polysilicon line must be separated from the silicon region by an oxide portion. Such an oxide portion may take the form of an oxide spacer formed along a side edge of the polysilicon line. After a refractory metal is deposited on the polysilicon, silicon region, and oxide spacer, the wafer is heated. A silicide is only formed over the polysilicon and silicon region, and no silicide is formed over the oxide spacers. The refractory metal is etched away from over the oxide spacers, and the now low resistivity polysilicon line remains insulated from the silicon region.

When desiring to form a continuous silicide layer over both a polysilicon line and an adjacent silicon region (such as a source, drain, or base region), a portion of the oxide spacer separating the polysilicon line from the silicon region must be removed. It has been discovered by the Applicants that in certain masking and etching processes for removing exposed portions of the oxide spacers from polysilicon lines, the oxide etching solution undesirably tunnels along oxide spacers under the photoresist mask. This tunneling can reach portions of other oxide spacers which are not desired to be etched away. This unintentional etching of an oxide spacer causes a silicide to form in the voids of the oxide spacer during the silicide formation process and undesirably forms a short under the oxide spacer. The silicide portions being shorted together may be overlying a base and an emitter region of a bipolar transistor, thus shorting these regions together and rendering the transistor inoperable. An example of this is described later with respect to FIGS. 8 and 9. Applicant's discovery of this reason for failure of a transistor is nonobvious. Such a situation may also occur for CMOS transistors where the silicide formed over a polysilicon gate shorts to a silicide portion formed over the source or drain region.

What is needed is an improved process to prevent tunneling of the oxide etching solution under a photoresist mask from damaging an oxide spacer. One such process to be improved is that described in U.S. Pat. No. 5,139,961, assigned to the present assignee and incorporated herein by reference.

SUMMARY

A masking method for use in a salicide formation process is disclosed herein which prevents an oxide etching solution from tunneling under a photoresist masking layer and reaching an oxide spacer. In one embodiment, this process is used during the formation of bipolar transistors. In another embodiment, this process is used during the formation of MOS transistors.

This process is particularly relevant to forming devices which are essentially formed in an island of silicon surrounded by field oxide. When a polysilicon layer is deposited over the silicon island and then selectively etched to form individual polysilicon lines, a top surface portion of the silicon island is also etched away to ensure complete removal of the polysilicon overlying the silicon. The polysilicon etch inherently creates a small step along the exposed edges of the silicon island where the silicon and the field oxide meet.

Oxide spacers are then formed along the sides of the polysilicon lines, and parasitic oxide spacers are inherently formed on the step along the edges of the silicon island.

Portions of the oxide spacers along the sides of the polysilicon lines must now be selectively removed, using a photoresist masking and etching process, to allow a continuous silicide layer to be formed over one or more polysilicon lines and adjacent silicon regions. In existing processes, this masking step was performed without consideration of the possibility of the oxide etching solution tunneling through the parasitic oxide spacers along the edges of the silicon island and reaching oxide spacers formed on the sidewalls of the polysilicon lines.

To avoid this nonobvious problem with existing processes, the present invention forms the opening in the mask to not extend over the parasitic oxide spacers formed along the edges of the silicon island. By preventing the etching solution from coming in contact with the parasitic oxide spacers, the etching solution cannot tunnel through the parasitic oxide spacers and damage oxide spacer portions not intended to be etched.

After the exposed oxide spacer portions have been removed, a refractory metal is deposited and heated to react the refractory metal with the underlying silicon or polysilicon. A conventional salicide formation step is then conducted to remove only the pure refractory metal from over any oxide portions and to leave the silicide. The remaining silicide is thus self-aligned with the exposed silicon and polysilicon regions.

DETAILED DESCRIPTION OF THE PREFERRED EMBODIMENTS

The present invention may be applied to any salicide formation process in which oxide is to be selectively etched in order to form self-aligned silicide regions. Accordingly, the processes described herein are illustrative only of selected uses of this invention. The inventive process will be described primarily with reference to a process for forming a bipolar transistor in an isolated island of silicon, although the process is equally applicable to forming MOS transistors.

The focus of this present disclosure is on a particular improvement in masking and etching oxide spacers which may be used in conjunction with prior art processes, such as described in U.S. Pat. No. 5,139,961. U.S. Pat. No. 5,139,961, assigned to the present assignee, provides additional details of various steps used to form a bipolar transistor which are only briefly described in this present disclosure.

Figure 1:
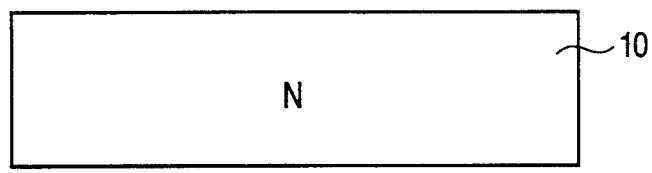
FIGS. 1, 2A, 3, 4, 5A, 6A, 7A, 10B, 12, and 13 are partial cross-sectional views of a silicon wafer during various stages in the preferred process for forming a bipolar transistor.

FIG. 1 is a partial cross-section of an N-type silicon wafer substrate 10 which may be used as a starting material. The N-type substrate 10 may also be an N-type well or epitaxial layer formed in or over a P-type material.

Figure 2A:
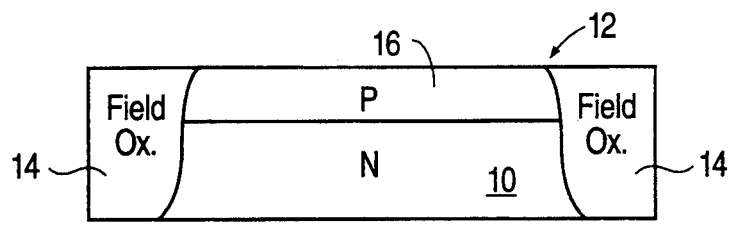
Figure 2B:
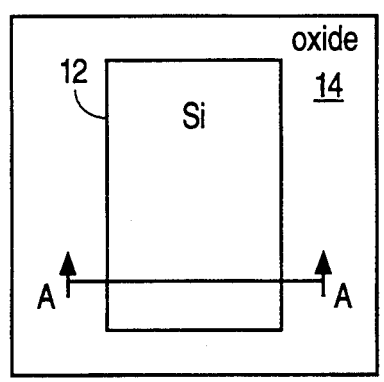
FIGS. 2B, 5B, 7C, 10A, and 11 are top down views of the corresponding structures shown in cross-section.

As shown in FIGS. 2A and 2B, isolated silicon islands 12 are then formed in the wafer where it is desired to form electrically isolated components. Isolated silicon islands 12 may be formed by any number of methods. In one method, the wafer is masked and conventional field oxide is grown from silicon island 12 surrounded by field oxide 14. In another method, trenches are etched around silicon portions to a desired depth, such as through an N-type epitaxial layer or well (i.e., substrate 10) to a P-type substrate. Field oxide 14 is then deposited in the trenches formed by the silicon etching step. The surface of the wafer is then made planar (if desired) by using conventional processes such that the islands 12 of N-type silicon remain surrounded by the field oxide 14. FIG. 2B is a top-down view of a single rectangular island 12. FIG. 2A is a cross-section along line A—A in FIG. 2B.

In the present embodiment, an NPN bipolar transistor will be formed in the surface of the N-type silicon island 12. To this end, a P-type base 16 is formed in the surface of the silicon island 12 to a desired depth. The base 16 may be formed by introducing boron or other P-type impurities into exposed silicon surfaces of the wafer by using ion implantation or any other suitable technique. P-type impurities may also be introduced by diffusing P-type dopants from a later-formed polysilicon layer into the surface of N-type substrate 10.

Figure 3:
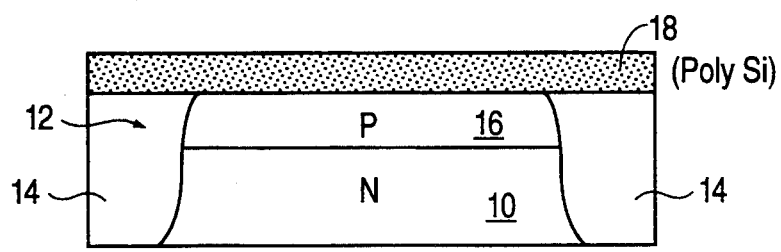

As shown in FIG. 3, a polysilicon layer 18 is then deposited on the surface of the wafer using conventional techniques. The thickness of polysilicon layer 18 may be on the order of 1 micron.

A layer of oxide 19 (FIG. 4) is then grown over the surface of polysilicon layer 18.

Figure 4:
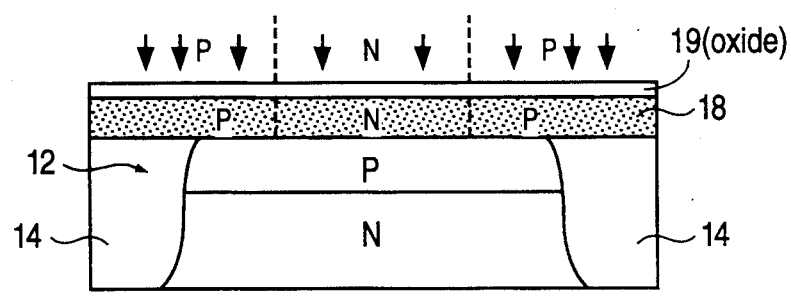

In the illustrative embodiment, dopants within the polysilicon layer 18 itself, as shown in FIG. 4, are used to form P+ base contact regions and an N+ emitter region in the base 16. To selectively dope polysilicon layer 18, polysilicon layer 18 is suitably masked in a first masking step, and N-type dopants, such as arsenic or phosphorous, are implanted into the polysilicon areas overlying where N-type emitters are to be formed in the P-type base 16. In a second masking step, P-type dopants, such as boron, are implanted into the polysilicon areas overlying where P+ base contact regions are to be formed in the P-type base 16. The dopants may be implanted in any order. These dopants in polysilicon layer 18 will be driven into the base 16 at a later time.

A layer of nitride 20 is then deposited over the oxide 19.

Figure 5A:
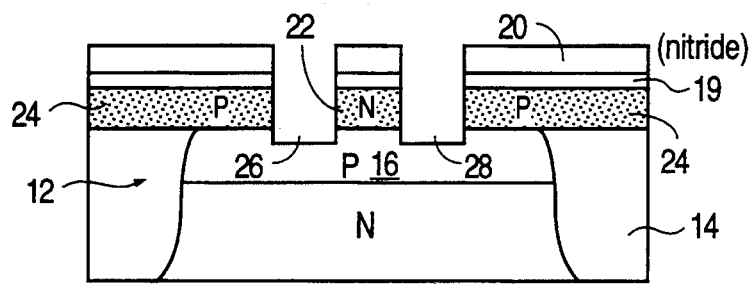
Figure 5B:
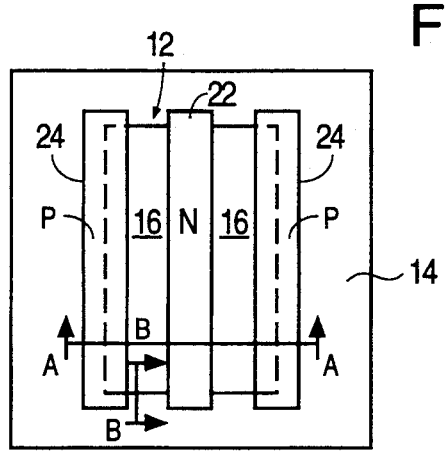

The polysilicon layer 18 is then masked and etched, as shown in FIGS. 5A and 5B, to form an N-type emitter polysilicon line 22 and P-type base polysilicon lines 24. FIG. 5A is a cross-section taken along line A—A in FIG. 5B, where FIG. 5B is a top down view of the structure. In the step illustrated in FIGS. 5A and 5B, the selective etching of the polysilicon layer 18 is conducted using a conventional plasma etch or other suitable etch. Due to the inherent nonuniformity in the polysilicon layer 18 and the etch process, and due to the varying topography of the underlying silicon, the polysilicon layer 18 is over-etched to ensure the complete removal of polysilicon over regions where the polysilicon is undesired. Such over-etching is shown by the depressions 26 and 28 (FIG. 5A) formed in the silicon island 12. Such depressions 26 and 28 may extend between 1000 and 1500 Angstroms below the polysilicon layer 18 of FIG. 4.

Figure 5C:
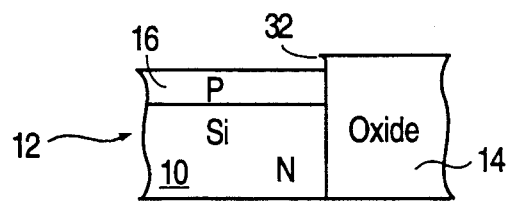
FIGS. 5C, 6B, and 7B are magnified cross-sectional views taken along line B—B in FIG. 5B during various stages of the process.

This polysilicon etching process also inherently creates a step 32 (FIG. 5C) along the exposed edge of the island 12 where the silicon island 12 meets the field oxide 14. A cross-section of an edge portion of the silicon island 12 and the resulting step 32 is shown in FIG. 5C, where FIG. 5C is taken along line B—B in FIG. 5B.

Figure 6A:
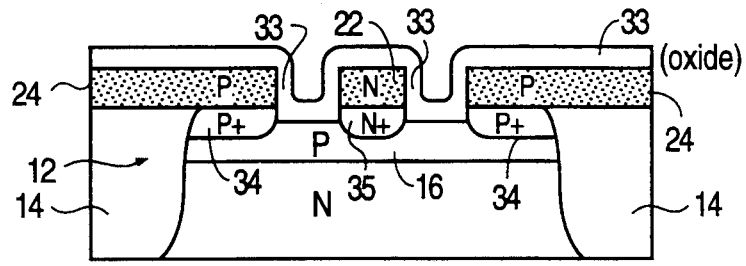
Figure 6B:
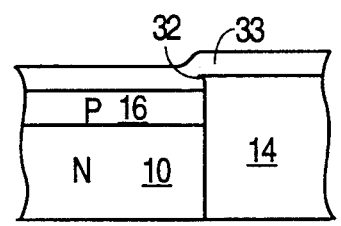

Using conventional techniques, the exposed silicon/polysilicon is then oxidized to form a thin layer of pure oxide over the exposed silicon surfaces. An additional P-type dopant implant may then be conducted to additionally dope the exposed regions of the P-type base 16. The oxide 19 and nitride 20 are then removed using conventional techniques. Additional oxide 33 is then deposited over the surface of the wafer, as shown in FIG. 6A and 6B, to a depth of approximately 0.2 microns. FIG. 6B shows a cross-section of an edge portion of silicon island 12.

During the heating steps used to oxidize the silicon/polysilicon and deposit the oxide 33, the P and N-type dopants in the polysilicon layer 18 are diffused into the base 16 to form P+ base contact regions 34 and an N+ emitter region 35.

Figure 7A:
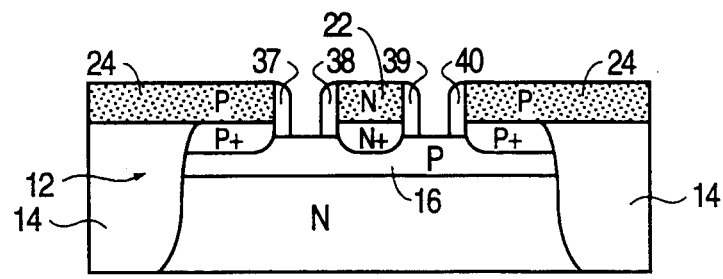

The oxide 33 is then anisotropically etched using a conventional plasma etch to remove the oxide 33 from the horizontal surfaces of the silicon and polysilicon over which it is desired to form a silicide. As shown in FIG. 7A, after this oxide etching step, oxide sidewall spacers 37, 38, 39, and 40 remain on the vertical sides of the polysilicon lines 22 and 24. The oxide spacers 37–40 may have a thickness on the order of approximately 1500 Angstroms or greater.

Figure 7B:
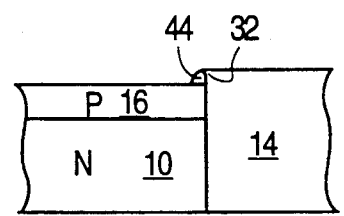

As shown in FIG. 7B, a parasitic oxide spacer 44 remains on the step 32 along the edge of the silicon island 12 running between the polysilicon lines 22 and 24.

Figure 7C:
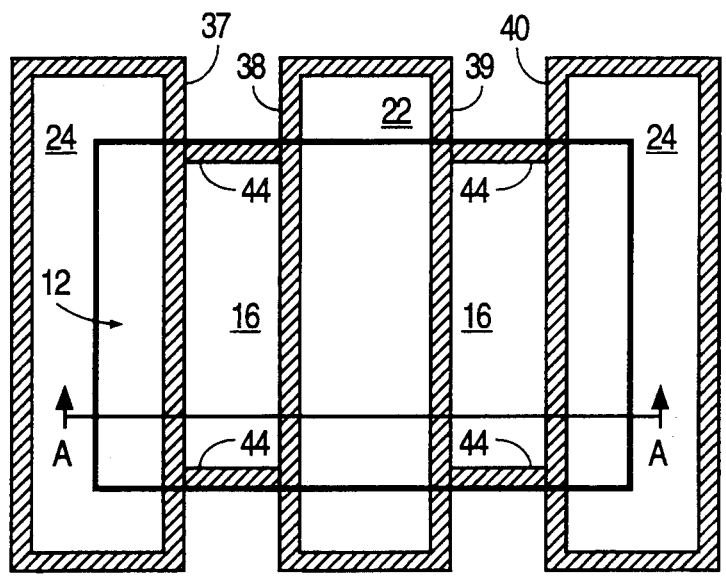

FIG. 7C is a top-down view of the resulting structure, where FIG. 7A is a cross-section of FIG. 7C taken along line A—A in FIG. 7C. FIG. 7C shows the oxide spacers 37-40 formed on the sides of the polysilicon lines 22 and 24 and also shows the parasitic oxide spacers 44.

The polysilicon lines 24 in FIG. 7C may also serve to illustrate source and drain lines for an MOS transistor, and polysilicon line 22 may serve to illustrate a gate for the MOS transistor. Regions 16 would then be source and drain regions.

It is now desirable to form a continuous silicide layer over each base polysilicon line 24 and its adjacent base 16 portion. It is also desirable that a silicide be formed over the emitter polysilicon line 22 which does not electrically contact the extrinsic base 16 or the base polysilicon lines 24. To this end, a portion of the oxide sidewall spacers 37 and 40 must now be removed so that there will be no gap in the silicide layer formed over the base polysilicon lines 24 and the base 16.

Figure 8:
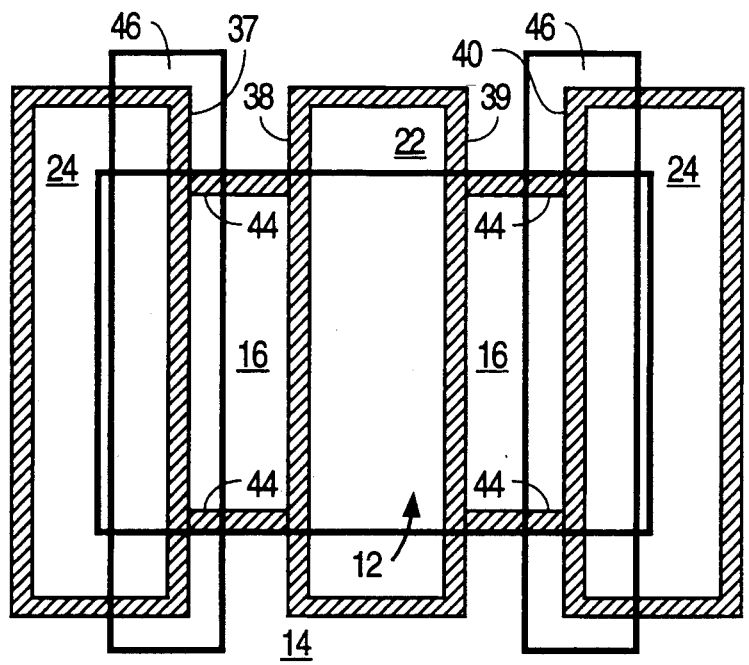
FIGS. 8 and 9 are top down views of a structure formed using a masking and etching process which is to be improved by the present invention.

In previous processes, as illustrated by the bipolar or MOS process of FIG. 8, a photoresist mask layer was selectively exposed and developed to form an opening 46 (shown by rectangular outline) in the photoresist to expose portions of oxide spacers 37 and 40. These exposed oxide spacer portions are to be etched away in a subsequent oxide etching step. As shown in FIG. 8, the opening 46 also exposes the parasitic oxide spacer 44 along the edge of the silicon island 12. The wafer of FIG. 8 is then subjected to a wet oxide etch to remove the exposed portions of oxide spacers 37 and 40. The etching solution also tunnels through the parasitic oxide spacers 44 under the photoresist and reaches the oxide spacers 38 and 39 along the edges of the polysilicon emitter 22. The field oxide 14 is generally etched by the solution at a rate much slower than the etching rate of the deposited, parasitic oxide spacers 44 due to the inherent differences between grown oxide and deposited oxide.

Figure 9:
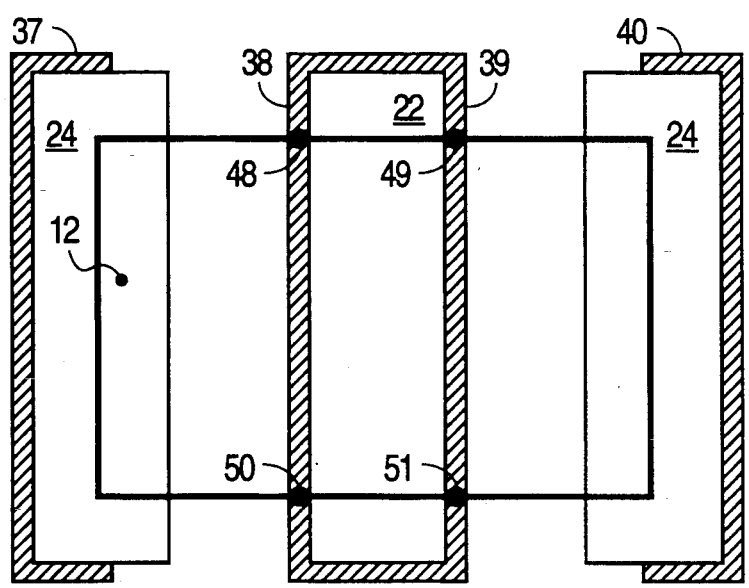

FIG. 9 illustrates the undesirable results of the process described with respect to FIG. 8. As shown in FIG. 9, the oxide spacers 38 and 39 have been damaged at the locations 48, 59, 50, and 51. During a subsequent silicide formation step, the silicide will form through the areas 48–51 of the oxide spacers 38 and 39 which have been damaged and thus short the emitter polysilicon line 22 to the silicide formed over the base 16. This shorting of the silicide layer causes a significant yield loss due to excessive leakage or direct emitter-base and/or gate-source/drain shorts. The existence and cause of this problem was nonobvious. By removing this problem, the most significant failure mechanism associated with the oxide spacer removal process will have been eliminated. It should be noted that the particular masking and etching process described with respect to FIGS. 8 and 9 is not necessarily prior art, but is used only to illustrate the general lack of understanding of a potential cause of yield loss.

Figure 10A:
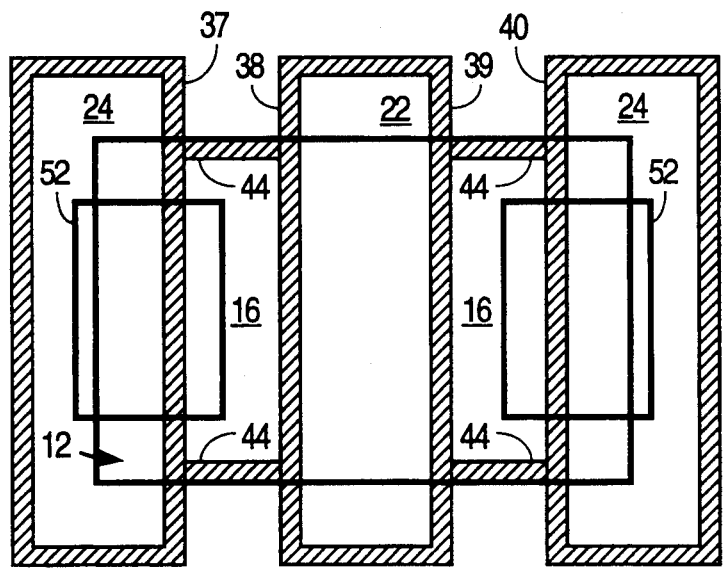
Figure 10B:
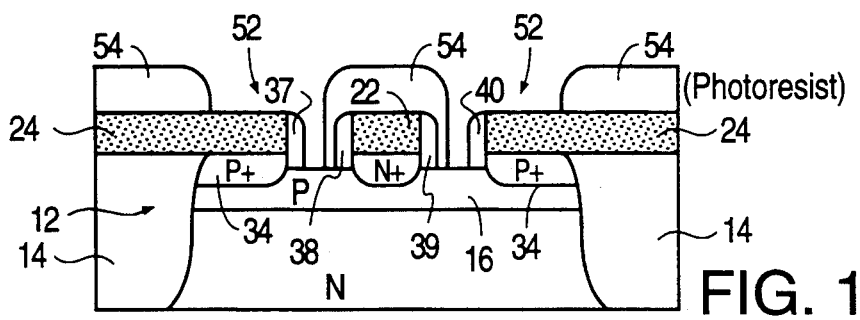

FIG. 10A illustrates the preferred mask opening 52 formed in a layer of photoresist 54 (FIG. 10B) to expose the portions of the oxide spacers 37 and 40 to be removed. A cross-sectional view of this embodiment is shown in FIG. 10B where the developed photoresist 54 exposes portions of oxide spacers 37 and 40 but masks oxide spacers 38 and 39. As shown in the top view of FIG. 10A, the photoresist mask opening 52 does not extend down to the parasitic oxide spacers 44 and thus the oxide etching solution cannot tunnel through the parasitic oxide spacers 44 to destroy portions of the oxide spacers 38 and 39.

Figure 11:
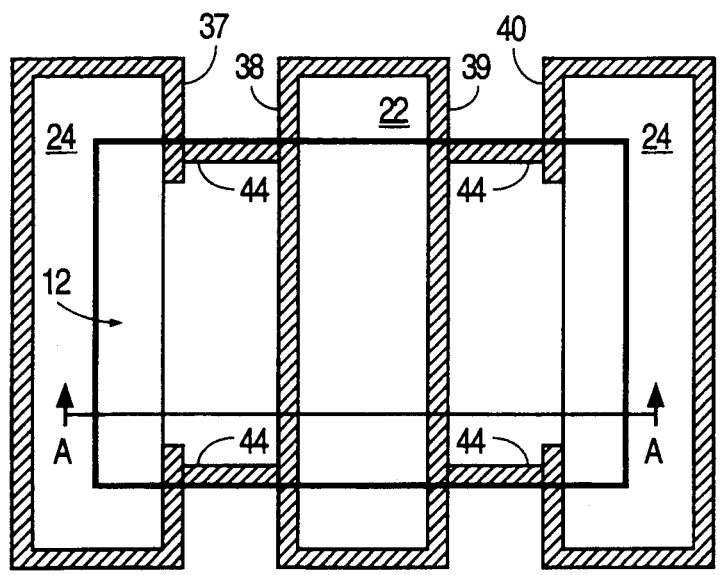

In a next step, the wafer is dipped into or otherwise subjected to a conventional oxide etching solution, such as HF or NH$_4$F (also known as a buffered oxide etch (BOE) solution). The etching solution will dissolve the exposed portions of the oxide spacers 37 and 40 as shown in the top view of the resulting structure in FIG. 11. As illustrated in FIG. 11, portions of the oxide spacers 37 and 40 above and below the mask opening 52 (FIG. 10A) have been etched away due to some limited tunneling effects. However, the etching solution was not able to reach the parasitic oxide spacers 44. Hence, no tunneling by the etching solution occurred along the parasitic oxide spacers 44, and the oxide spacers 38 and 39 along the emitter polysilicon line 22 remained intact.

Figure 12:
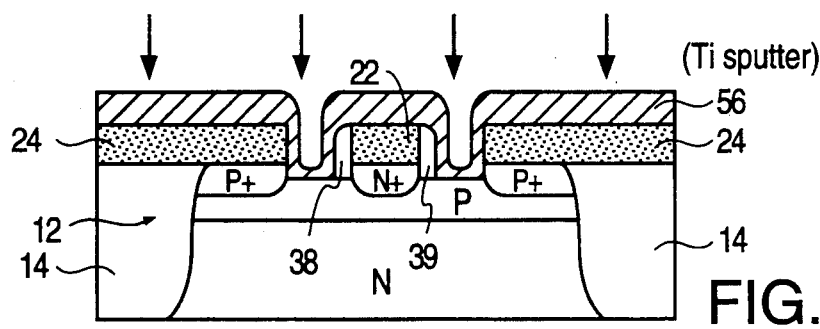

A conventional salicide formation process is then performed, wherein a layer of refractory metal 56, such as titanium, is sputtered onto the surface of the wafer, as shown in FIG. 12o The cross-sectional view of FIG. 12 is taken along line A—A in FIG. 11. The wafer is then heated to react the refractory metal 56 with the exposed silicon and polysilicon to form a silicide, such as TiSi$_2$. The refractory metal 56 does not react with the oxide sidewall spacers 38 and 39.

Figure 13:
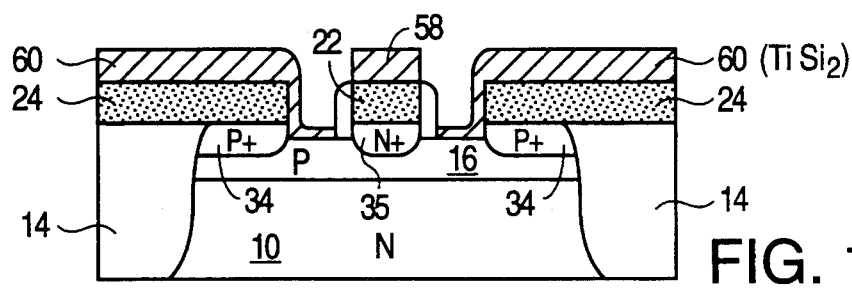

The wafer is then dipped into a solution of, for example, H$_2$O$_2$/NH$_4$OH which etches away only the pure refractory metal 56 but does not etch the silicide. Hence, the pure refractory metal 56 remaining over oxide spacers 38 and 39 is removed while the silicide 58 and 60 formed over the polysilicon lines 22 and 24 and exposed base 16 remains, as shown in FIG. 13. As seen, the low resistivity silicide 60 formed over the base 16 and base polysilicon lines 24 is electrically isolated from the silicide 58 formed over the emitter polysilicon line 22.

The wafer is again heated to lower the resistivity of the resulting silicide to a desired level.

The resulting structure forms an NPN bipolar transistor where the N-type substrate 10 (or epitaxial layer or well) forms a collector of the NPN bipolar transistor. The electrical contact to the emitter region 35 is made through the silicide 58 and polysilicon line 22, and the electrical contact to the base 16 is made through the silicide 60 and polysilicon lines 24.

Figure 14:
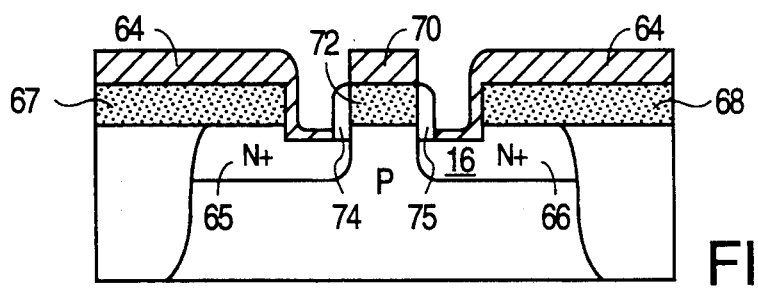
FIG. 14 is a partial cross-sectional view of an MOS transistor which may be formed using the present invention.

This process for selectively removing oxide sidewall spacers may also be applied to improve the existing processes for forming MOS transistors in an island of silicon. One such type of MOS transistor is shown in FIG. 14. In FIG. 14, a salicide layer 64 is formed over the source 65 and drain 66 as well as over the polysilicon lines 67 and 68. The salicide layer 64 is isolated from the salicide layer 70 formed over the polysilicon gate 72 by using oxide spacers 74 and 75 formed using a method virtually identical to that described with respect to FIGS. 1–7C and 10–13. Those skilled in the art would understand the different masking steps required to apply the above concepts to forming any type of bipolar or MOS transistor.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method for forming a continuous silicide layer over a polysilicon portion and a silicon region, said method comprising:

isolating an area of silicon on a silicon wafer by forming an island of silicon surrounded by field oxide, said island having edges;

depositing a polysilicon layer over a top surface of said island;

etching said polysilicon layer to form one or more separate polysilicon portions over said island, said step of etching causing a portion of said top surface of said island to be etched after etching through said polysilicon layer and causing a raised step to be formed along etched edges of said island;

forming oxide sidewall spacers along exposed side surfaces of said polysilicon portions and said raised step, said exposed side surfaces being substantially perpendicular to said top surface of said island;

forming a mask over said oxide sidewall spacers, said mask having an opening for exposing a portion of one or more of said oxide sidewall spacers along said side surfaces of one or more of said polysilicon portions but not exposing a portion of said oxide sidewall spacers formed along said raised step;

etching said oxide sidewall spacers exposed through said mask opening using an oxide etching solution so as to remove exposed portions of said oxide sidewall spacers, wherein said mask opening is situated so as not to allow said etching solution to tunnel under said mask and through said oxide sidewall spacers along said raised step;

depositing a layer of refractory metal over one or more of said polysilicon portions, over said oxide sidewall spacers, and over exposed portions of said island;

heating said refractory metal to alloy said metal with any underlying polysilicon and silicon and form a silicide; and removing portions of said refractory metal overlying said oxide sidewall spacers.

2. The method of claim 1 further comprising the step of:

forming a doped region of a first type in said top surface of said island adjacent to one of said polysilicon portions, wherein said step of forming said mask exposes a portion of an oxide sidewall spacer along a side surface of said one of said polysilicon portions adjacent to said doped region so that a continuous layer of said silicide will be formed over said one of said polysilicon portions and said doped region.

3. The method of claim 2 wherein said doped region is a base of a bipolar transistor.

4. The method of claim 2 where said doped region is a source of an MOS transistor.

5. The method of claim 2 wherein said doped region is a drain of an MOS transistor.

6. The method of claim 1 wherein said polysilicon portions comprise a base contact polysilicon portion and an emitter contact polysilicon portion for a bipolar transistor, and wherein a portion of an oxide sidewall spacer along said base contact polysilicon portion is exposed during said step of forming a mask and is etched away by said oxide etching solution so that said silicide may form a continuous layer over said base contact polysilicon portion and an extrinsic base region formed in said island adjacent to said base contact polysilicon portion.

7. The method of claim 1 wherein said polysilicon portions comprise a source contact polysilicon portion and a gate polysilicon portion for an MOS transistor and wherein a portion of an oxide sidewall spacer along said source contact polysilicon portion is exposed during said step of forming a mask and is etched away by said oxide etching solution so that said silicide may form a continuous layer over said source contact polysilicon portion and a doped region formed in said island adjacent to said source contact polysilicon portion.

8. The method of claim 1 wherein said polysilicon portions comprise a drain contact polysilicon portion and a gate polysilicon portion for an MOS transistor and wherein a portion of an oxide sidewall spacer along said drain contact polysilicon portion is exposed during said step of forming a mask and is etched away by said oxide etching solution so that said silicide may form a continuous layer over said drain contact polysilicon portion and a doped region formed in said island adjacent to said drain contact polysilicon portion.

9. The method of claim 1 wherein said opening in said mask does not overlap any edges of said island.

* * * * *